United States Patent

Dachniwskyj et al.

[11] Patent Number: 5,570,021
[45] Date of Patent: Oct. 29, 1996

[54] MR GRADIENT SET COIL SUPPORT ASSEMBLY

[75] Inventors: Roman I. Dachniwskyj, Pewaukee, Wis.; David E. Dean, Florence, S.C.; Thomas G. Ebben, Sullivan, Wis.; Perry S. Frederick, Waukesha, Wis.; Donald J. Jenders, Brookfield, Wis.; Michael J. Radziun, Waterford, Wis.; Peter L. Sue, Florence, S.C.

[73] Assignee: General Electric Company, Milwaukee, Wis.

[21] Appl. No.: 541,673

[22] Filed: Oct. 10, 1995

[51] Int. Cl.$^6$ .................................................... G01V 3/00
[52] U.S. Cl. .................................... 324/318; 128/633.5
[58] Field of Search ............................ 324/318, 322, 324/314, 307, 309; 128/653.5

[56] References Cited

U.S. PATENT DOCUMENTS

| | | | |
|---|---|---|---|
| 4,636,729 | 1/1987 | Maurer et al. | 324/318 |
| 5,084,676 | 1/1992 | Saho et al. | 324/322 |
| 5,235,283 | 8/1993 | Lehne et al. | 324/318 |
| 5,256,969 | 10/1993 | Miyajima et al. | 324/318 |
| 5,309,105 | 5/1994 | Sato et al. | 324/318 |
| 5,481,191 | 1/1996 | Rzedzian | 324/318 |

*Primary Examiner*—Louis M. Arana
*Attorney, Agent, or Firm*—James O. Skarsten; John H. Pilarski

[57] ABSTRACT

An arrangement is provided for supporting the inner and outer gradient coils of one or more gradient coil sets, the coils of each gradient coil set providing one of the orthogonal gradient magnetic fields for an MR imaging system. The arrangement includes an inner cylindrical coil form disposed to supportably carry an inner gradient coil of a coil set, an outer cylindrical coil form in coaxial spaced-apart relationship with the inner coil form disposed to supportably carry an outer gradient coil of the coil set, and a stiffening cylinder positioned between the inner and outer coil forms to divide the space therebetween into first and second volumes. A thermally conductive adhesive material, such as an epoxy containing alumina particulate material, is inserted into the first and second volumes to bond both the inner and outer coil forms to the stiffening cylinder, in order to hold the inner and outer gradient coils respectively carried by the coil forms in rigid fixed relationship with respect to one another.

12 Claims, 5 Drawing Sheets

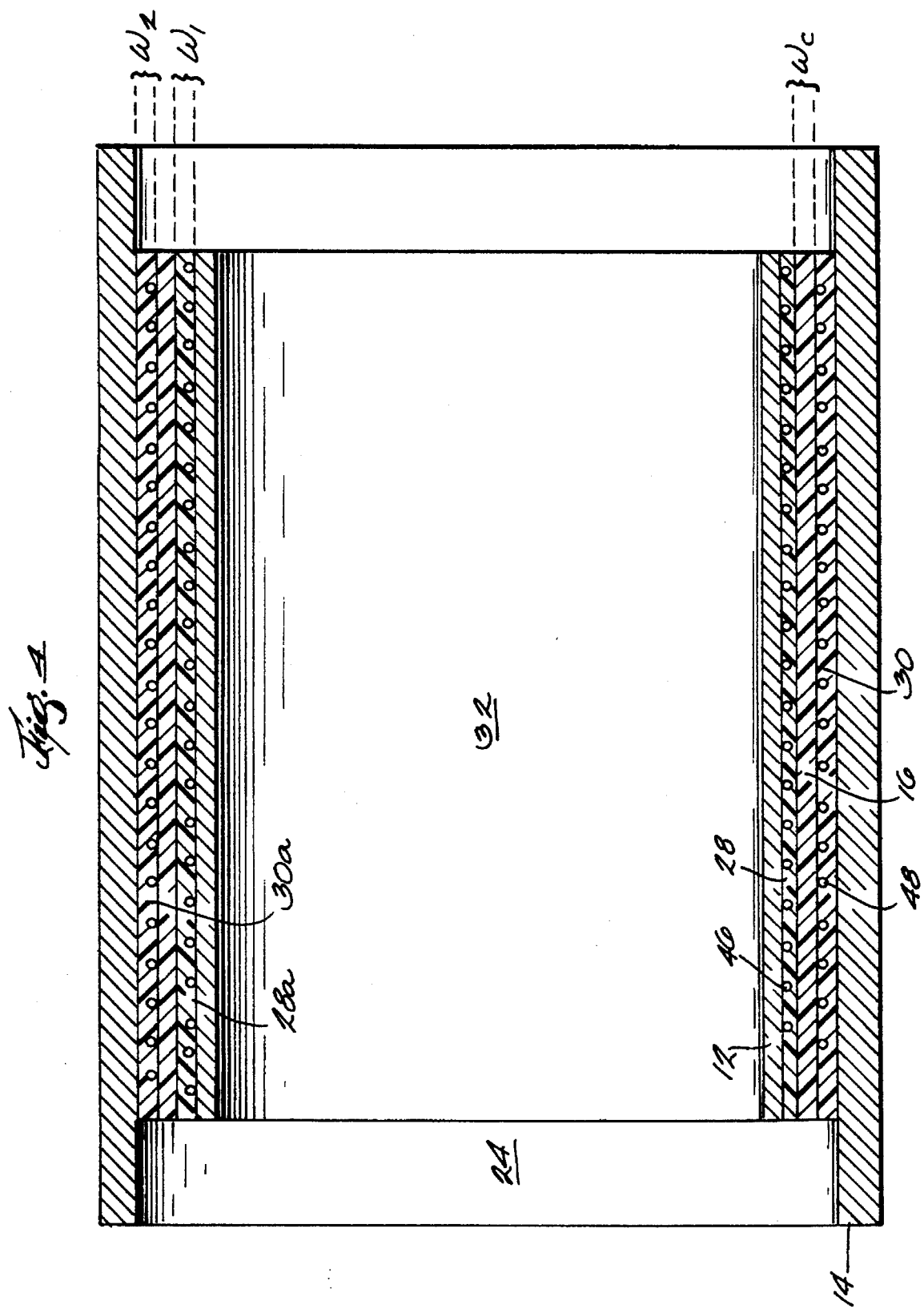

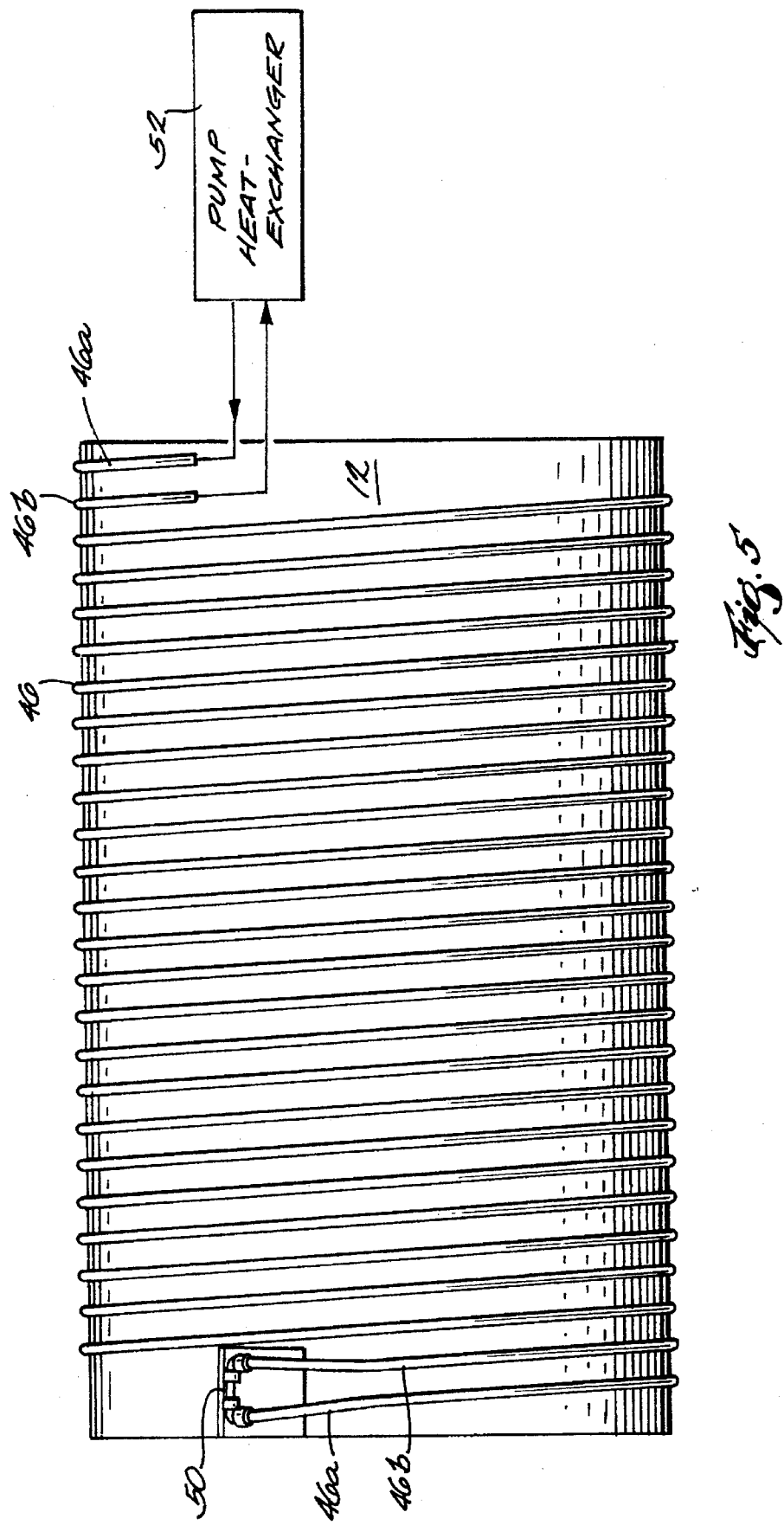

MR GRADIENT SET COIL SUPPORT ASSEMBLY

BACKGROUND OF THE INVENTION

The invention disclosed and claimed herein pertains to structural apparatus for supporting the coils of a gradient coil pair or set for the main magnet of a magnetic resonance (MR) imaging system, wherein the coils are selectively spaced apart from one another and are energized interactively to generate a gradient magnetic field within a specified volume, such as the magnet bore. More particularly, the invention pertains to support structure for gradient coils of such type wherein the current therethrough is substantially increased.

It has become well known in MR imaging to employ a gradient coil pair or set, also known as a self-shielded or Roemer gradient coil set, to generate each of the gradient magnetic fields, i.e., the X-, Y-, and Z-gradient fields. Generally, a gradient coil set has two gradient coils, each wrapped around one of two cylindrical coil forms, one of the forms having a greater diameter than the other, and the forms being in spaced-apart coaxial relationship within the bore of the associated MR main magnet. Each coil of a set is actuated or energized by a current to produce a magnetic field, the two coils being designed in relation to each other so that their fields combine within the magnet bore to produce a resultant magnetic field comprising one of the gradient fields. The fields of the two coils cancel each other out outside the outer coil form, so as not to modify or alter the main magnetic field. A gradient coil pair or set is described, for example, in commonly assigned U.S. Pat. No. 4,737,716, issued Apr. 12, 1988 to Roemer et. al., and for which re-examination certificate B1, 4,737,716 was issued.

It is now common practice in MR imaging to place the inner coils for X-, Y-and Z-gradient coil sets on a single inner coil form, and to place the corresponding outer X-, Y- and Z- coils on a single outer coil form which is in coaxial relationship with the inner form. Thus, the inner and outer coils of each coil set are in spaced apart relationship with each other. In a typical arrangement, each coil of the Z-gradient coil set comprises a wire helically wound around one of the coil forms. Each coil of the X-gradient coil set comprises a fingerprint coil or the like, which is etched or otherwise formed on a sheet or board of copper, each such sheet being wrapped around a coil form over the Z-gradient windings. The Y-gradient coils likewise comprise fingerprint coils formed on copper sheets, one such sheet being wrapped around each coil form over the sheet containing the X-gradient windings, but in orthogonal relationship therewith.

When current pulses are coupled to the coils of a coil set which is contained within the static field of the MR main magnet, mechanical forces are applied thereto, which tend to displace the coils relative to their respective coil forms. Accurate positioning of the coils relative to their forms is critical for proper generation of gradient fields, so that such forces must be opposed to prevent displacement. In the past, the amounts or levels of current coupled to the coils was sufficiently small that the coils could be firmly held in place on the coil forms by means of tape or the like. Now, however, there is increasing interest in substantially raising the level of the current coupled to the coils to achieve significantly higher performance in MR imaging. The anticipated increase in current level would cause sufficiently strong forces to be applied to the coils that the taping method of the prior art would not be capable of holding the coils in place. Mechanical vibration would be likely to occur, which could damage the coils and also generate a much higher level of noise in the surrounding environment. Moreover, the increased current levels produce significant amounts of heat proximate to the coils. The heat must be conducted away from the coils and the magnet bore region, to prevent damage to the coils and related structure, to avoid unwanted changes in the main magnetic field due to heating of magnet components, and also to prevent unacceptable heating of a patient or other subject in the bore.

One approach would be to fill the space between the coil forms with an adhesive such as epoxy. However, in common gradient coil designs, the volume between the gradient coil forms may be too large for the epoxy to cure uniformly, and possess the mechanical material properties to ensure reliable use in MR imaging. Thus, the epoxy could harden in some regions before hardening in other adjacent regions. This could result in cracking of the epoxy, and could also subject adjacent structure to additional forces and stress. Also, the large volume could significantly increase epoxy curing time.

SUMMARY OF THE INVENTION

The present invention is directed to a gradient coil support assembly for an MR imaging system, and includes a first cylindrical coil form disposed to supportably carry a first gradient coil of a gradient coil set, and further includes a second cylindrical coil form disposed to supportably carry a second gradient coil of the set, the second coil form being positioned in coaxial spaced-apart relationship with the first coil form. A stiffening cylinder is positioned between the first and second coil forms to divide the space between the first and second coil forms into a first volume located between the stiffening cylinder and the first coil form, and a second volume located between the stiffening cylinder and the second coil form. An adhesive material is inserted into the first and second volumes to bond both the first and second coil forms to the stiffening cylinder, and to thereby hold the first and second gradient coils in rigid fixed relationship with respect to each other.

In a preferred embodiment, wherein the second coil form has a larger diameter than the first coil form, flexible tubes are helically positioned around the first coil form and located in the first volume, and also helically positioned around the stiffening cylinder and located in the second volume. Means are provided for directing coolant through the tubes to remove heat from regions proximate to the gradient coils. Preferably, a layer of filament, such as a fiberglass element, is wrapped around each coil form and the gradient coil thereon to provide additional means to tightly hold each coil onto its respective coil form. Preferably also, the thickness of the stiffening cylinder is selected in relation to the spacing between the first and second coil forms to provide respective dimension for the first and second volumes, which are intended to optimize curing of the epoxy therein. More specifically, the dimensions are intended to provide a specified minimum curing time. Also, the epoxy in each volume is thereby caused to cure or harden uniformly, i.e., the epoxy at each point in the volume hardens at very nearly the same time.

An object of the invention is to provide an improved means for attaching and supporting the coils of a gradient coil set with respect to their respective coil forms.

Another object is to provide an attaching and supporting means of such type which is capable of opposing vibrations and coil displacement resulting from the strong mechanical forces applied to the coils when significantly higher currents are coupled thereto while the coils are located in a static magnetic field.

Another object is to provide attaching and supporting means of the above type which includes epoxy or like adhesive, wherein the sizes of the respective volumes into which the epoxy is introduced are reduced in order to enhance curing uniformity and also to significantly reduce epoxy curing time.

Another object is to provide attaching and supporting means of the above type which allows active cooling loops to greatly reduce undesirable heating resulting from operation of the coils at higher current levels.

Another object is to significantly reduce noise effects in gradient coils operated at higher current levels.

These and other objects of the invention will become more readily apparent from the ensuing specification, taken together with the accompanying drawings.

BRIEF DESCRIPTION OF THE DRAWINGS

FIG. 4 is a simplified sectional view taken along lines 4—4 of FIG. 1, with end rings removed.

FIG. 5 shows an inner coil assembly and pump-heat exchanger for the embodiment of FIG. 1.

DETAILED DESCRIPTION OF THE PREFERRED EMBODIMENT

Figure 1:
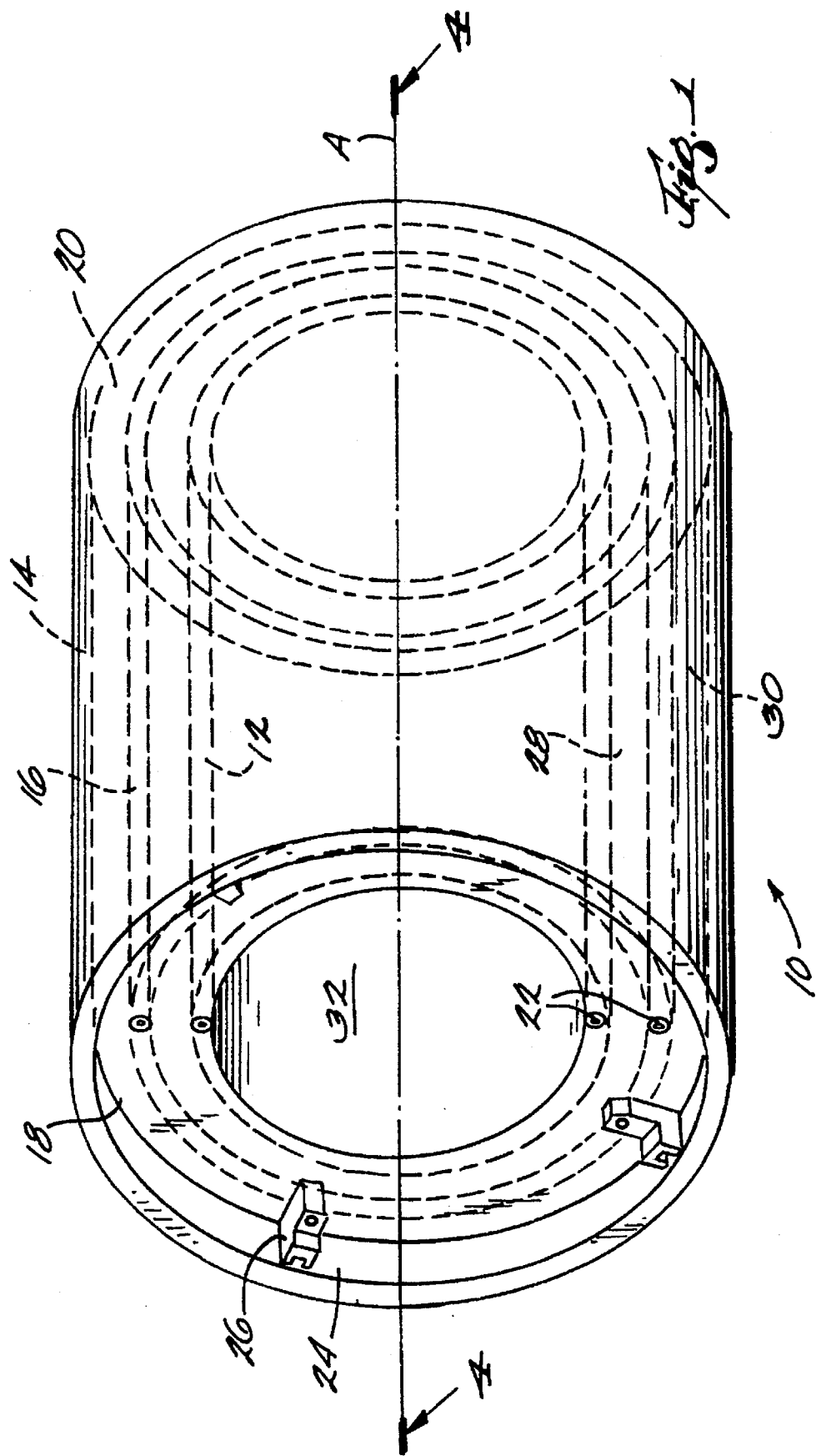
FIG. 1 is a perspective view showing an embodiment of the invention.

Referring to FIG. 1, there is shown a gradient coil support assembly 10 for an MR imaging system (not shown) comprising cylindrical inner and outer gradient coil assemblies 12 and 14, and a stiffening cylinder 16. As described hereinafter in greater detail, assembly 12 includes the inner coils for X-, Y- and Z-gradient coil pairs or sets. Assembly 14 includes the respective corresponding outer coils therefor. The assemblies and cylinder are held in spaced-apart coaxial relationship with each other, by means described hereinafter. The axis A shown in FIG. 1 is thus the common axis for all such cylindrical members 12, 14 and 16. More specifically, cylinder 16 partitions the space between coil assemblies 12 and 14 into two volumes, each having an annular cross section and extending between the ends of members 12 and 16. Cylinder 16 generally is formed of a material such as fiberglass reinforced plastic (FRP). Outer gradient coil assembly 14 is provided with annular edge members 24 at its ends, which extend outwardly past members 12 and 16.

The volume or space between inner coil assembly 12 and cylinder 16 is filled with a layer of epoxy 28, and the volume between the cylinder 16 and the outer gradient assembly 14 is filled with a layer of epoxy 30. Epoxy layer 28 joins substantially each point on the outer surface of coil assembly 12 to the inner surface of cylinder 16. In like manner, layer 30 joins substantially each point on the inner surface of outer gradient coil 14 to the outer surface of cylinder 16.

FIG. 1 shows the cylindrical members 12, 14 and 16 joined at their respective ends to end rings 18 and 20. End rings 18 and 20 are provided to rigidly hold the members 12, 14 and 16 in the desired spaced apart co-axial relationship while the epoxy of layers 28 and 30 cures or sets up. Thereafter, end rings 18 and 20 are removed. Accordingly, end rings 18 and 20 are joined to inner gradient assembly 12 and cylinder 16 by means of removable bolts or screws 22. The end rings are removably joined to outer coil assembly 14 by means of L-shaped clamps 26 respectively bolted to an end ring, and also to an edge member 24 of the coil assembly 14. The epoxy used for layers 28 and 30 contains alumina particulate material to increase its thermal conductivity. This enhances the effectiveness of the epoxy in conducting heat generated by respective gradient coils away from coil assemblies 12 and 14. In addition to providing good thermal conductivity, the epoxy of layers 28 and 30 is air curable and is provided with mechanical strength to resist the forces generated when electric currents are coupled to the gradient coils.

FIG. 1 also shows inner coil assembly 12 provided with a bore 32. In accordance with conventional practice, the gradient coil set 10 shown in FIG. 1 is inserted into the bore of the main magnet (not shown) of an MRI system so that Axis A aligns with the bore axis of the main magnet. The coils of gradient coil set 10 may then be actuated by coupling an electric current thereto to provide a gradient field in the bore, as required for MR imaging.

Figure 2:
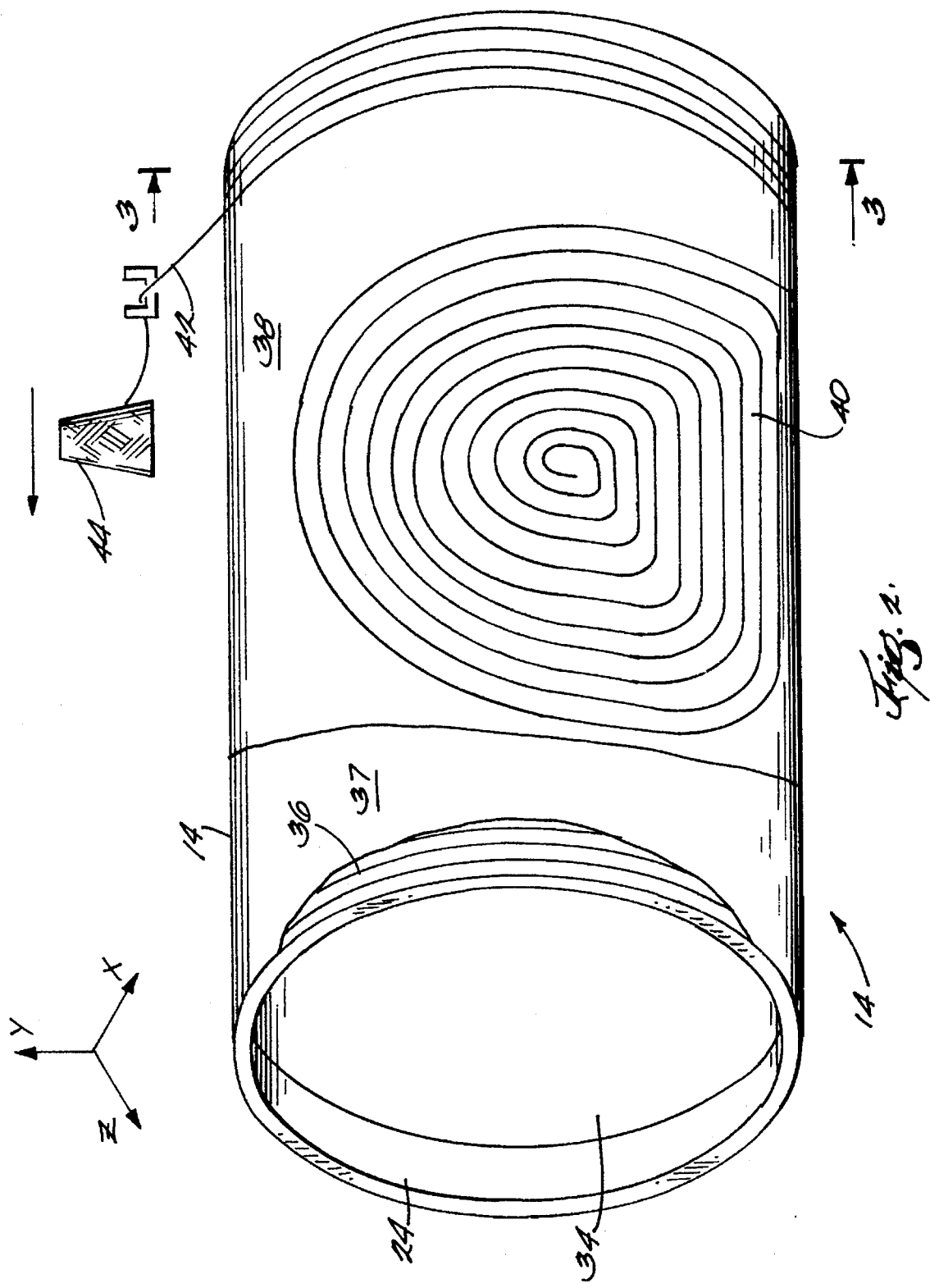
FIG. 2 is a perspective view with a section broken out showing an outer gradient coil assembly for the embodiment of FIG. 1.

Referring to FIG. 2, there is shown outer coil assembly 14 including a cylindrical coil form 34, usefully constructed of FRP fiberglass following techniques well known in the art. Assembly 14 further includes wire or like conductor 36, which is helically wound around the outer circumference of coil form 34 in a conventional manner, between the edge members 24 thereof, to form the outer coil for a Z-gradient coil set.

Referring further to FIG. 2, there is shown a coil board 37 wrapped around coil form 34 over the Z-gradient coil windings. There is further shown a coil board 38 wrapped around coil form 34, over board 37. Each of the coil boards 37 and 38 comprises a sheet of copper having an FR4 fiberglass backing. A series of fingerprint coils are etched or otherwise formed on the copper sheets of boards 37 and 38, to respectively provide the outer gradient coils for the Y- and X-gradient sets. One such fingerprint coil 40, etched in X-gradient coil board 38, is shown in FIG. 2 by way of illustration. While not shown, an identical pattern of coils 40 may be etched in Y-gradient coil board 37. Such coils are described in greater detail in the Roemer et. al. patent, referred to above. Y-gradient coil board 37 and X-gradient coil board 38 are placed on coil form 34 so that the gradient fields respectively generated by the coils thereof will be in orthogonal relationship with each other.

FIG. 2 further shows a strand of filament 42 or prepreg filaments wound around X-gradient coil board 38, in order to rigidly hold the boards 37 and 38 and windings 36 in place upon the coil form. The filament 42 usefully comprises a strand of FRP e-glass, which is unwound from a spool 44 or the like, as the spool is translated along the length of outer gradient coil assembly 14 as assembly 14 is rotated.

When coils are etched in copper boards 37 and 38, it is likely that sharp corners or edges will be formed in the copper. As is well known, a very large difference in voltage potential can occur between the conductors of adjacent gradient coils during an MR sequence, such as between Z-gradient conductor 36 and Y-gradient coil board 37, and between Y-gradient coil board 37 and X-gradient coil board 38. Because of the high potential difference, an electrical discharge can occur between conductors at the sharp edges.

Figure 3:
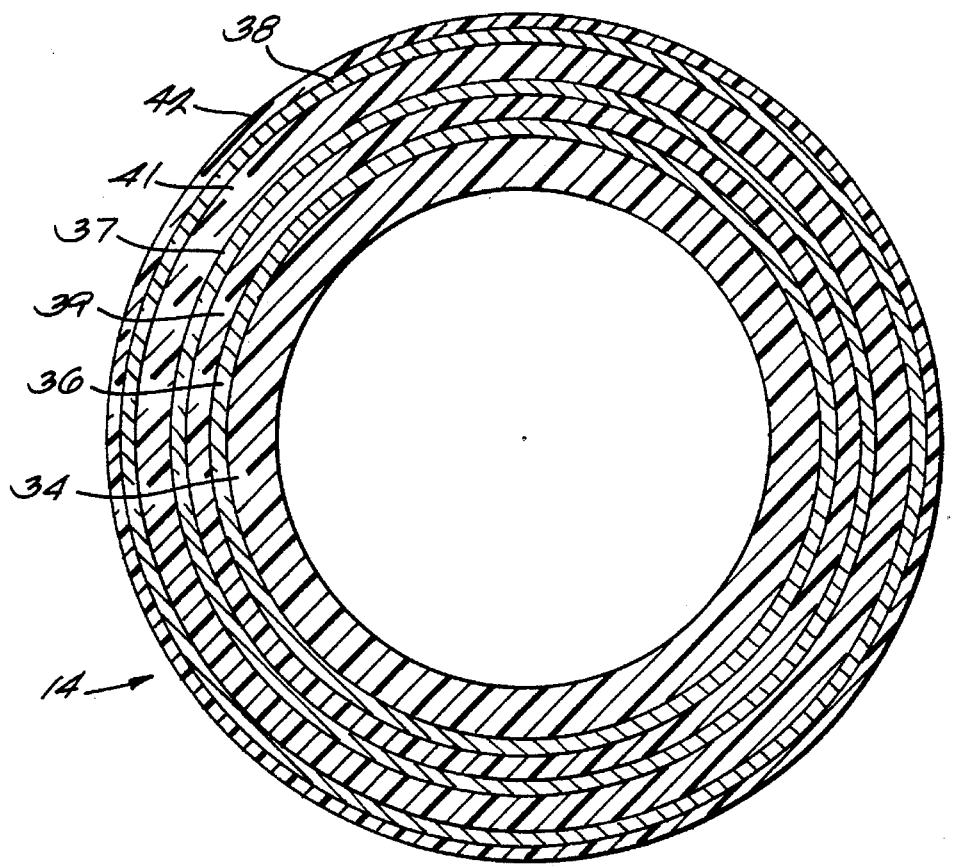
FIG. 3 is a sectional view through the plane identified by lines 3—3 of FIG. 2.

Referring to FIG. 3, there is shown outer coil assembly 14 in greater detail. In particular, there is shown a layer of epoxy 39 between Y-gradient coil board 37 and Z-gradient coil 36 and coil form 34. There is further shown a layer of epoxy 41 positioned between coil boards 37 and 38. In addition to holding respective coil boards 37 and 38 in place on coil form 34, the epoxy of layers 39 and 41 is selected to be corona resistant. For example, the epoxy could be a product known in the art which contains fumed silica. Thus, such epoxy serves to prevent or reduce discharges of the type referred to above.

Inner coil assembly 12 is described hereinafter, in connection with FIG. 6.

Referring to FIG. 4, there is shown flexible hollow tubing 46, usefully formed of nylon material, wrapped around inner coil assembly 12, in close proximity to the outer surface thereof. Tubing 46 is located in the volume containing epoxy layer 28, and is held in place thereby. As discussed hereinafter in connection with FIG. 5 of the drawings, tubing 46 is wrapped around inner coil assembly 12 in a helical fashion.

As stated above, when high levels of current are coupled to gradient coils such as those formed on copper coil boards 37 and 38, substantial amounts of heat are generated proximate thereto. The heat could melt solder joints (not shown), delaminate the gradient coil boards, or do other damage to the coil boards or to the epoxy. Also, the heat could cause discomfort or even possible injury to a patient in the bore of the associated main magnet. By providing the tubing 46, a helical passage is provided proximate to the coil boards of inner coil 12. A coolant, such as water, can thus be circulated through tubing 46 to remove heat from the region around inner coil assembly 12 and from the volume containing epoxy layer 28.

Similarly, tubing 48, also formed of a nylon material, is wrapped around the stiffening cylinder 16, in close proximity to the outer diameter thereof, and is held in place by epoxy layer 30 in the volume filled thereby. Tubing 48 is also wrapped in a helical fashion around cylinder 16. A coolant is circulated through tubing 48 to move heat generated by coil boards 37 and 38 of the outer coil assembly, when currents are coupled thereto, from the region proximate to such coil boards and from the volume containing epoxy layer 30.

When epoxy is inserted into the volumes between inner coil assembly 12 and cylinder 16, and between cylinder 16 and outer coil assembly 14 to respectively form layers 28 and 30, it tends to be channeled by, to flow along, the helically wound tubing 46 and 48. It has been found that this substantially reduces lathering, i.e., the formation of clusters of small bubbles in the epoxy, in regions 28a in epoxy layer 28 and regions 30a in epoxy layer 30. This, in turn, has the effect of strengthening epoxy layers 28 and 30, and reduces the possibility of cracking therein. Thus, provision of the helically wrapped tubing provides an additional benefit. A region 28a is the space generally defined by two adjacent wraps of tubing 46 and the outside diameter of inner coil assembly 12. Similarly, a region 30a is the space generally defined by two adjacent wraps of tubing 48 and the outside diameter of stiffening cylinder 16.

Referring further to FIG. 4, there is shown the spacing between the outer diameter of cylinder 16 and the inner diameter of outer coil assembly 14 to be a width dimension $w_1$. In like manner, the spacing between the inner diameter of cylinder 16 and the outer diameter of inner coil assembly 12 comprises a width dimension $w_2$. $W_1$ and $w_2$ are respectively selected to ensure that the volumes respectively filled by epoxy layer 28 and epoxy layer 30 are sufficiently small to cause the epoxy to cure uniformly. The desired minimum dimensions $w_1$ and $w_2$ are achieved by selecting a width or thickness $w_c$ for cylinder 16 in relation to the spacing between the outer diameter of inner coil assembly 12 and the inner diameter of outer coil assembly 14. For example, if such spacing is on the order of 2 inches, $w_c$ could be on the order of 0.75 inches to provide a width $w_1$ of 0.75 inches and a width $w_2$ of 0.50 inches.

Referring to FIG. 5, there is shown tubing 46 wrapped around inner coil assembly comprising two separate lengths of tubing 46a and 46b. One end of each length is joined to a coupling 50, which is attached to assembly 12 at the leftward end thereof, as viewed in FIG. 5. Coupling 50 provides a passage to direct the flow of coolant fluid from one of the lengths into the other. The two lengths are wrapped around inner coil assembly 12 in an alternating helical manner, and the ends thereof, located at the rightward end of assembly 12 as viewed in FIG. 5, are coupled to a pump-heat exchanger apparatus 52. More particularly, apparatus 52 directs coolant fluid, such as water, into tubing length 46a for circulation around assembly 12, to conduct heat away therefrom. The fluid returns through length 46b to the pump-heat exchanger 52, which operates to remove heat therefrom.

While not shown, tubing 48 around cylinder 16 is configured in generally the same manner, and is likewise coupled to pump-heat exchanger 52.

Figure 6:
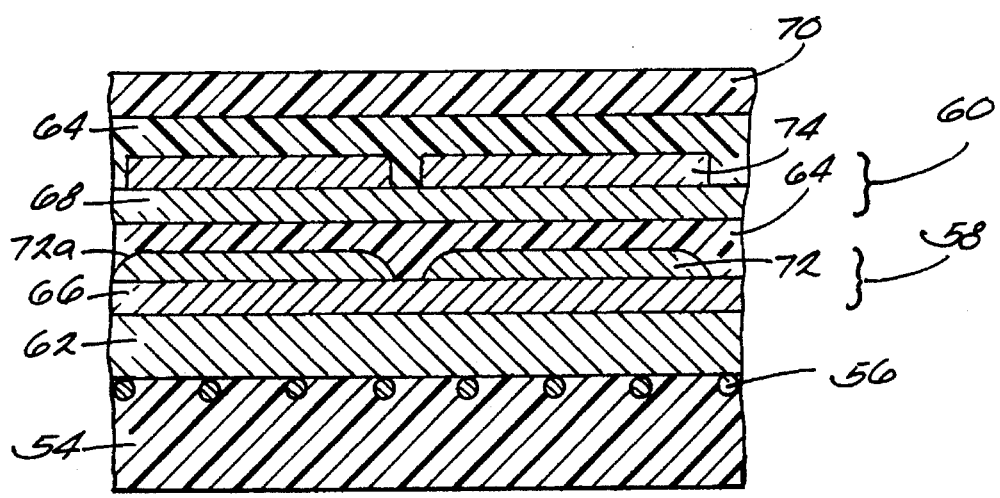
FIG. 6 is a view showing a portion of a cross-section of the inner coil assembly shown in FIG. 5.

Referring to FIG. 6, there is shown inner coil assembly 12 generally comprising the same components as outer assembly 14. Thus, inner coil assembly 12 includes a cylindrical coil form 54 made of FRP fiberglass, a helically wound Z-gradient coil 56 and Y-gradient and X-gradient coil boards 58 and 60, respectively. A layer of corona resistant epoxy 62 is inserted between coil 56 and coil board 58, and a layer 64 thereof is inserted between coil boards 58 and 60. Coil boards 58 and 60 respectively comprise sheets of copper with FR4 fiberglass backings 66 and 68. A series of fingerprint coils are etched in each copper sheet to provide respective patterns of inner Y- and X-gradient coils. The helical Z-gradient coil 56, together with coil 36, forms the Z-gradient coil set for support assembly 10. The inner Y- and X-gradient coils, together with the coils of coil boards 37 and 38, respectively, form the Y- and X-gradient coil sets therefor. As with outer assembly 14, an outer layer 70 is formed around inner coil assembly 12 by wrapping an FRP filament therearound.

Referring further to FIG. 6, there is shown a portion of a Y-gradient coil 72 formed in coil board 58, and there is further shown a portion of an X-gradient coil 74 formed in coil board 60. FIG. 6 shows the edges 72a of respective turns of coil 72 to be rounded. By rounding the edges of respective Y-gradient coil turns, the problem of corona discharge, referred to above, is significantly reduced. The edges of Y-gradient coils, and of X-gradient coils if desired, can be rounded in both inner and outer coil assemblies 12 and 14.

Obviously, many other modifications and variations of the present invention are possible in light of the above teachings. It is therefore to be understood that within the scope of the disclosed concept, the invention may be practiced otherwise than as specifically described.

What is claimed is:

1. A gradient coil support assembly for an MR imaging system comprising:

a first cylindrical coil form disposed to supportably carry a first gradient coil of a gradient coil set;

a second cylindrical coil form disposed to supportably carry a second gradient coil of said set, said second coil form positioned in coaxial spaced-apart relationship with said first coil form;

a stiffening cylinder positioned between said first and second coil forms in spaced apart relationship with each of said forms to divide the space between said coil forms into first and second volumes; and an adhesive material inserted into said first and second volumes to bond both said first and second coil forms to said stiffening cylinder, in order to hold said first and second gradient coils respectively carried by said first and second coil forms in rigid fixed relationship with respect to one another.

2. The support assembly of claim 1 wherein said second coil form has a larger diameter than said first coil form, and wherein:

said adhesive is inserted into said first and second volumes to bond substantially each point on the outer surface of said first coil form and on the inner surface of said second coil form to an adjacent surface of said stiffening cylinder.

3. The support assembly of claim 1 wherein:

a flexible elongated member is helically positioned in at least one of said volumes to define a number of curing zones.

4. The support assembly of claim 3 wherein:

one of said flexible elongated members is helically positioned in each of said volumes, each of said elongated members comprising a tube; and means are provided for moving a coolant through each of said tubes to conduct heat away from the corresponding volume.

5. The support assembly of claim 3 wherein:

one of said flexible elongated members is helically positioned proximate to the surface of said first cylindrical coil form, and another of said flexible elongated members is helically positioned proximate to the outer surface of said stiffening cylinder.

6. The support assembly of claim 3 wherein:

gradient coils comprising respectively patterned sheets of conductive material are supportably carried on said first and second coil forms, each of said coils being covered by a layer of filament material wound around its corresponding coil form.

7. The support assembly of claim 6 wherein:

each of said filaments comprises a filament of fiberglass.

8. A gradient coil support assembly for an MR imaging system comprising:

a cylindrical inner coil form disposed to supportably carry a first inner gradient coil of a first gradient coil set;

a cylindrical outer coil form disposed to supportably carry a first outer gradient coil of said first gradient coil set, said outer coil form positioned in coaxial spaced-apart relationship with said inner coil form;

a stiffening cylinder positioned between said inner and outer coil forms to divide the space between said coil forms into first and second volumes; and a thermally conductive adhesive material inserted into said first and second volumes to bond both said inner and outer coil forms to said stiffening cylinder, in order to hold said gradient coils respectively carried by said inner and outer coil forms in rigid fixed relationship with respect to one another, and to conduct heat generated by operation of said coils to produce a gradient magnetic field away from said coil forms.

9. The support assembly of claim 8 wherein:

said adhesive material comprises an epoxy containing alumina particulate material.

10. The support assembly of claim 8 wherein:

a second inner gradient coil of a second gradient coil set is supportably positioned on said inner coil form in closely spaced relationship with said first inner gradient coil;

a second outer gradient coil of said second gradient coil set is supportably positioned on said outer coil form in closely spaced relationship with said first outer gradient coil; and a layer of corona discharge resistant adhesive material is inserted between said first and second inner gradient coils and between said first and second outer gradient coils.

11. The support assembly of claim 10 wherein:

the coils of said second gradient coil set are formed in copper sheets respectively wrapped around said inner and outer coil forms.

12. The support assembly of claim 11 wherein:

the edges of respective turns of the coils of said second set are rounded.

* * * * *